US009659370B2

(12) United States Patent
Buerger et al.

(10) Patent No.: US 9,659,370 B2
(45) Date of Patent: May 23, 2017

(54) CORTICAL BONE SEGMENTATION FROM MR DIXON DATA

(71) Applicant: KONINKLIJKE PHILIPS N.V., Eindhoven (NL)

(72) Inventors: Christian Buerger, Hamburg (DE); Irina Waechter-Stehle, Hamburg (DE); Jochen Peters, Norderstedt (DE); Eberhard Sebastian Hansis, Hamburg (DE); Frank Michael Weber, Hamburg (DE); Tobias Klinder, Uelzen (DE); Steffen Renisch, Hamburg (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 37 days.

(21) Appl. No.: 14/893,980

(22) PCT Filed: Jun. 19, 2014

(86) PCT No.: PCT/IB2014/062421
§ 371 (c)(1),
(2) Date: Nov. 25, 2015

(87) PCT Pub. No.: WO2014/203192
PCT Pub. Date: Dec. 24, 2014

(65) Prior Publication Data
US 2016/0110869 A1    Apr. 21, 2016

Related U.S. Application Data

(60) Provisional application No. 61/837,331, filed on Jun. 20, 2013.

(30) Foreign Application Priority Data

Aug. 7, 2013  (EP) ..................................... 13179531

(51) Int. Cl.
*G06K 9/00* (2006.01)
*G06T 7/00* (2017.01)
(Continued)

(52) U.S. Cl.
CPC .......... *G06T 7/0014* (2013.01); *G01R 33/481* (2013.01); *G01R 33/4828* (2013.01);
(Continued)

(58) Field of Classification Search
CPC ............................................. G06K 2009/4666
See application file for complete search history.

(56) References Cited

U.S. PATENT DOCUMENTS

2007/0223799 A1* 9/2007 Weiss ...................... B60R 25/00
382/131
2013/0230224 A1* 9/2013 Claude .................. A61B 5/055
382/131
2015/0161784 A1* 6/2015 Ma ........................ G06K 9/6215
382/131

OTHER PUBLICATIONS

Ma (NPL: Dixon Techniques for Water and Fat Imaging, Journal of Magnetic Resonance Imaging 28:543-558 (2008), p. 16.).*
(Continued)

*Primary Examiner* — Oneal R Mistry (57) ABSTRACT

The present invention relates to a method for segmenting MR Dixon image data. A processor and a computer program product are also disclosed for use in connection with the method. The invention finds application in the MR imaging field in general and more specifically may be used in the generation of an attenuation map to correct for attenuation by cortical bone during the reconstruction of PET images. In the method, a surface mesh is adapted to a region of interest by: for each mesh element in the surface mesh: selecting a water target position based on a water image feature response in the MR Dixon water image; selecting a fat target position based on a fat image feature response in the MR
(Continued)

Dixon fat image; and displacing each mesh element from its current position to a new position based on both its water target position and its corresponding fat target position.

15 Claims, 7 Drawing Sheets

(51) Int. Cl.

| | | |
|---|---|---|
| *G01R 33/48* | (2006.01) | |
| *G01R 33/56* | (2006.01) | |
| *G06K 9/46* | (2006.01) | |
| *G06K 9/52* | (2006.01) | |
| *G06K 9/62* | (2006.01) | |
| *G06T 7/60* | (2017.01) | |
| *G06T 11/00* | (2006.01) | |
| *G06T 7/37* | (2017.01) | |
| *G06T 7/73* | (2017.01) | |

(52) U.S. Cl.
CPC ......... *G01R 33/56* (2013.01); *G01R 33/5608* (2013.01); *G06K 9/4661* (2013.01); *G06K 9/52* (2013.01); *G06K 9/6215* (2013.01); *G06K 9/6267* (2013.01); *G06T 7/37* (2017.01); *G06T 7/60* (2013.01); *G06T 7/73* (2017.01); *G06T 11/003* (2013.01); *G06K 2009/4666* (2013.01); *G06T 2207/10088* (2013.01); *G06T 2207/10104* (2013.01); *G06T 2207/20048* (2013.01); *G06T 2207/30008* (2013.01); *G06T 2207/30061* (2013.01)

(56) References Cited

OTHER PUBLICATIONS

Yi Wang et al: "3D Multi-parametric Breast MRI Segmentation Using Hierarchical Support Vector Machine with Coil Sensitivity Correction", Academic Radiol0gy, vol. 20, No. 2, Oct. 23, 2012.

Ecabert, et al., "Automatic Model-Based Segmentation of the Heart in CI Images", IEEE Transactions on Medical Imaging, IEEE Service Center, Piscataway, NJ, US, vol. 27, No. 9, Apr. 30, 2008.

Michopoulou et al., "Atlas-Based Segmentation of Degenerated Lumbar Intervertebral Discs From MR Images of the Spine", IEEE Transactions on Biomedical Engineering, IEEE Service Center, Piscataway, NJ, USA, vol. 56, No. 9, Apr. 14, 2009.

C. Buerger, et al., "Investigation of MR-based attenuation correction and motion compensation for hybrid PET/MR", IEEE Transactions on Nuclear Science, vol. 58(5), p. 1967-1976, 2012.

Y. Berker, et al., "MRI-Based Attenuation Correction for Hybrid PET/MRI Systems: A 4-Class Tissue Segmentation Technique Using a Combined Ultrashort-Echo-Time/Dixon MRI Sequence", The Journal of Nuclear Medicine, vol. 53 (5), p. 796-804, 2012.

V. Schulz, et al., "Automatic, three-segment, MR-based attenuation correction for whole-body PET/MR data", European Journal of Nuclear Medicine and Molecular Imaging, vol. 38, p. 138-152, 2011.

\* cited by examiner

FIG. 1

FIG. 2 a) Water image/ Features b) Fat image/ Features

FIG. 3

FIG. 4 a) Pat 3　　　　　b) Pat 4　　　　　c) Pat 5 d) Pat 6　　　　　e) Pat 7　　　　　f) Pat 8

FIG. 5

Pat 9: Water failure

Pat 10: Fat failure a) Water features     b) Fat features     c) Multi-modal features

CORTICAL BONE SEGMENTATION FROM MR DIXON DATA

CROSS REFERENCE TO RELATED APPLICATIONS

This application is a national filing of PCT application Ser. No. PCT/IB2014/062421, filed Jun. 19, 2014, published as WO 2014/203192 on Dec. 24, 2014, which claims the benefit of U.S. Provisional Application No. 61/837,331 filed Jun. 20, 2013 and also claims benefit of European Patent Application Number 13179531.2 filed Aug. 7, 2013, all of which are incorporated herein by reference.

FIELD OF THE INVENTION

The invention relates to a method for segmenting MR Dixon image data. A processor and a computer program product are also disclosed for use in connection with the method. The invention finds application in the field of MR imaging in general and more specifically may be used in the segmentation of cortical bone features in MR Dixon image data. The invention finds further application in the generation of an attenuation map to correct for attenuation by cortical bone during the reconstruction of PET images. The invention also finds application in the planning of radiation therapy treatment using MR-acquired images.

BACKGROUND OF THE INVENTION

Emerging hybrid imaging systems in which magnetic resonance (MR) imaging is combined with positron emission tomography (PET) have recently attracted interest for a variety of clinical indications including oncology. Whilst PET provides functional information with high sensitivity, the superior soft tissue contrast of MR gives excellent anatomical localization. However, in PET imaging systems the necessity arises to generate attenuation maps that describe the attenuation of the 511 keV gamma photons created by positron annihilation.

Conventionally such attenuation maps are generated from a computed tomography (CT) image since the Hounsfield units of x-ray radiation attenuation may be mapped directly to gamma photon attenuation values. Frequently, CT and PET imaging are combined in a hybrid PET/CT imaging system in order to generate such attenuation maps. However the integration of a CT imaging system with a hybrid PET/MR imaging system presents numerous issues relating to integration, compatibility and cost.

MR Dixon sequences have been investigated for the generation of PET attenuation maps. Using Dixon techniques, soft tissue can be readily separated into its water and fat components. A document "*Tissue classification as a potential approach for attenuation correction in whole-body PET/MRI: evaluation with PET/CT data*", *Journal of Nuclear Medicine* 50(4) (2009) 520-526; by Martinez-Moeller, A. et al, reports that with moderate additional effort, attenuation maps with four compartments (background, lung tissue, muscle and connective watery tissue, and fatty tissue) can be generated. However, cortical bone tissue, such as the vertebrae, is not visible in standard MR sequences and is commonly ignored during attenuation correction (AC) which can lead to substantial errors especially for metastases located close to bone.

A document "*MRI-Based attenuation correction for hybrid PET/MRI systems: A 4-class tissue segmentation technique using a combined ultrashort-echo-Time/Dixon MRI sequence*", *Journal of Nuclear Medicine* 53(5) (2012) 796-804, by Berker, Y. et al reports that ultrashort echo time (UTE) sequences have also been successfully combined with Dixon imaging to include bone tissue in AC of the head. However, UTE is still prone to imaging artefacts and long scan times with respect to whole-body applications.

Image processing techniques have also been used to segment vertebrae from MR images. An intensity based approach is reported in document "*Atlas-based segmentation of degenerated lumbar intervertebral discs from MR images of the spine*", *IEEE Transactions on Biomedical Engineering* 56(9) (2009) 2225-2231, by Michopoulou, S. et al. Conventionally such intensity-based approaches use a single MR image for vertebra detection, most commonly a T1- or a T2-weighted MR image.

However, the above approaches to generation of PET attenuation maps suffer variously from poor segmentation of cortical bone, or from the drawbacks of increased acquisition times consequent to the need to acquire additional imaging data from UTE, T1 or T2-weighted images.

SUMMARY OF THE INVENTION

It is an object of the invention to provide a method for improved segmentation of MR Dixon image data that allows for the segmentation of cortical bone. The method finds particular application in the generation of attenuation maps for use in PET imaging and is described with reference thereto; however it is to be appreciated that the method also finds application in the broader field of MR image segmentation. A processor and a computer program product are also disclosed for use in connection with the method.

In accordance with one aspect of the invention a method for segmenting MR Dixon image data is disclosed. The method comprises the steps of: receiving an MR Dixon water image relating to a region of interest; receiving an MR Dixon fat image relating to a region of interest; adapting a surface mesh model having a plurality of mesh elements to the region of interest by: for each mesh element in the region of interest: selecting, from the current mesh element position and from a plurality of positions displaced from the current mesh element position, a water target position based on a water image feature response in the MR Dixon water image; selecting, from the current mesh element position and from a plurality of positions displaced from the current mesh element position, a fat target position based on a fat image feature response in the MR Dixon fat image; and displacing each mesh element from its current position to a new position based on both its water target position and its corresponding fat target position.

By using MR Dixon data, no additional scans such as T1/T2 are required, resulting in a reduction of image acquisition time. MR Dixon images are clinically accepted for anatomical localization, and furthermore provide additional contrast with intrinsically perfect registration. Furthermore, artefacts related to chemical shift are avoided. The ability to segment cortical bone from MR Dixon image data improves the accuracy of the segmentation because such features are conventionally ignored owing to the difficulty in extracting them from MR image data. Furthermore the method simplifies the generation of a PET attenuation map since this may be obtained from a hybrid PET/MR imaging system without the associated risk of organ motion in transferring a patient from a separate CT imaging system. Advantageously the use of both the water and the fat images improves segmentation because the images provide more information compared to an individual scan. Furthermore, the images are intrinsically registered. Furthermore and MR imaging artefacts related to the chemical shift between water and fat are avoided.

In accordance with another aspect of the invention, a method for obtaining a PET attenuation map using the segmented MR image is disclosed. The attenuation map accounts for cortical bone attenuation. Advantageously a more accurate PET attenuation map is obtained.

In accordance with another aspect of the invention, a method for obtaining a PET attenuation map is disclosed in which the segmented MR image is used in combination with analysis of the MR Dixon fat image to discriminate between cortical bone, and bone marrow. Advantageously an even more accurate PET attenuation map is obtained.

In accordance with another aspect of the invention, different attenuation coefficients characteristic of the absorption of specific anatomical bone types are assigned to different volumes bounded by the surface mesh model. A volume bounded by the surface mesh model corresponds to at least a portion of a particular anatomical bone. By assigning an attenuation coefficient that corresponds to the specific anatomic bone, a more accurate PET attenuation map is generated. This is because the density and thus the gamma photon attenuation coefficient of for example a pelvis bone differs from that of the femur, a vertebra, a rib, scapula, tibia and so on. The ability to assign anatomically-dependent attenuation coefficients is enabled by the improved segmentation of the MR image. In order to identify which attenuation coefficient to assign to a volume defined by the surface mesh model, the surface mesh model may for example be compared with a reference anatomical bone model and volumes that are defined by the surface mesh model may be mapped to spatially-corresponding anatomical bone types.

In accordance with another aspect of the invention a PET attenuation map is generated in which a spatially-varying gamma photon attenuation coefficient is assigned to a volume bounded by the surface mesh model; wherein the value of the gamma photon attenuation coefficient is determined in accordance with a template distribution for the volume. Owing to the improved segmentation provided by the surface mesh model, a spatially-varying template attenuation coefficient distribution characteristic of a particular bone may be assigned to one or more of the regions bounded or defined by the surface mesh model. The density, and thus the gamma photon absorption coefficient of a bone such as for example a femur, a vertebra, a rib, scapula, tibia and so on, varies along its length and its cross section. Consequently by mapping a spatially-varying template distribution of the gamma photon absorption coefficient in a specific bone to the segmented volume, a more accurate PET attenuation map is obtained. The template distribution may be determined in accordance with gamma photon attenuation measurements on a specific anatomical bone, or from a model of the gamma photon attenuation in such an anatomical region.

In accordance with another aspect of the invention a processor configured to execute the method steps of the invention is disclosed.

In accordance with another aspect of the invention a computer program product comprising instructions which when executed on a processor cause the processor to carry out the method steps of the invention is disclosed. The computer program product may be a computer-readable storage medium, such as a floppy disc, a magnetic hard drive, a USB drive, an optical disc, ROM or RAM and furthermore the computer executable instructions may be downloadable.

BRIEF DESCRIPTION OF THE FIGURES

Table 1 illustrates validation of vertebra segmentations from all 25 patients. For each vertebra, mesh surface distances to the reference ground truth annotation as well as the amount of triangles showing an error of larger than 5 mm were computed. We compared segmentations using (a) water features, (b) fat features and (c) the proposed multi-modal (water and fat) image features. As can be observed, segmentations using water and fat features showed mean errors of 2.89 mm and 2.22 mm, respectively, while our multi-modal features achieved highest segmentation accuracy with a clear reduction to a mean error 1.69 mm (over all 17 vertebrae and all 25 patients), which is within the order of the image resolution (0.8×0.8×3 mm).

DETAILED DESCRIPTION OF THE INVENTION

In order to provide a method for improved segmentation of MR image data that allows for the segmentation of cortical bone the method of the current invention uses MR Dixon image data.

In MR Dixon images, image contrast varies between the water and fat image: in some cases the image contrast around the vertebrae is better in the water image (and would therefore be favourable for segmentation), whilst in other cases the contrast is better in the fat image (and would therefore be favourable for segmentation). In accordance with one aspect of the invention a segmentation is executed that takes advantage of both the water and fat contrast. By treating each of the water and fat images separately, rather than fusing the two images into a single image, the segmentation method avoids a potential insertion of compounding artefacts and a potential loss of valuable information.

In the present invention a 3D model-based segmentation framework is used to extract cortical bone from structured from MR Dixon data. In the example implementation disclosed herein a 3D model-based segmentation framework that was originally developed for cardiac CT segmentations is adapted to automatically extract seventeen vertebrae (from sacrum to neck: lumbar vertebra 1-5 as well as thoracic vertebra 1-12) from a Dixon MR acquisition. The approach is based on adapting a single mesh to multiple images, the water and fat image. During adaptation, each point on the mesh surface is attracted by feature points that are once detected in the water image and another time in the fat image. These multi-modal features used within a single segmentation are the main novel contribution of this paper. Segmentation results from 25 patients are provided, and compared with segmentations using only the water or the fat image alone. The method is validated using manually annotated ground truth data and a segmentation accuracy (mesh surface distances) of 1.69 mm is achieved, thus an improvement of 41% and 24% compared to the water and fat segmentation, respectively.

Figure 1:
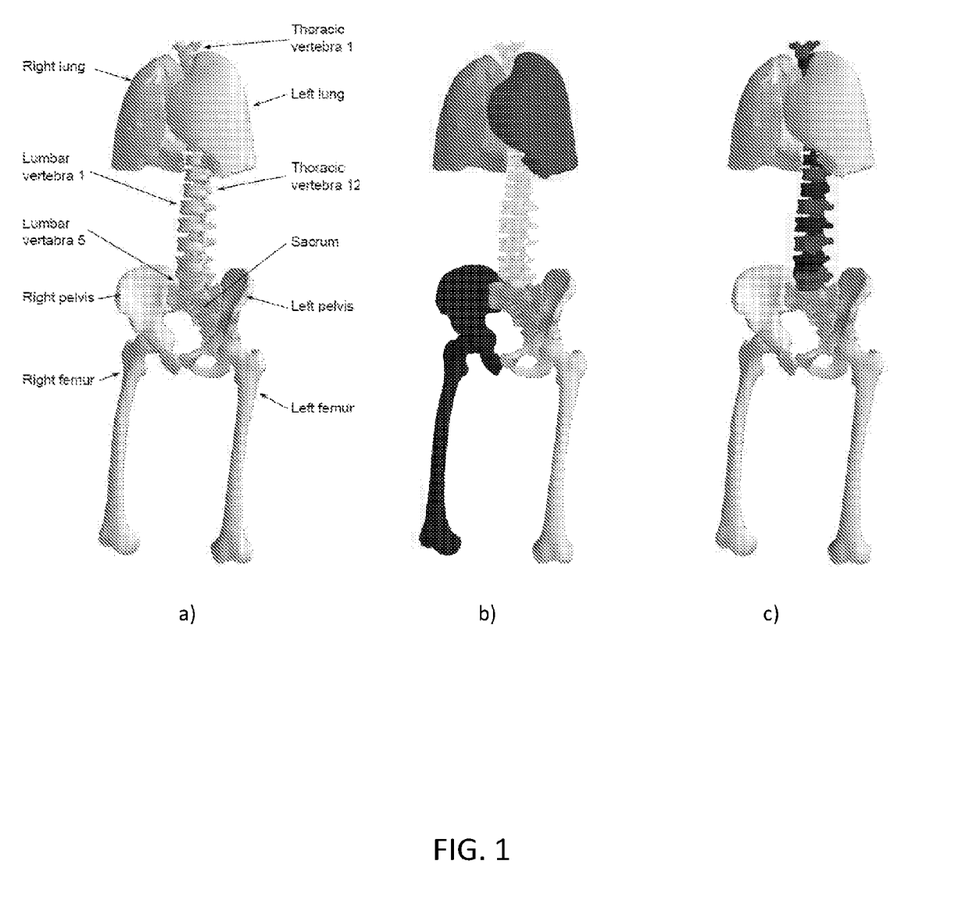
FIG. 1 illustrates a segmentation model and segmentation process. (a) The model compartments being used for model localization (based on the generalized Hough transform). (b) Parametric adaptation. Individual affine transformations are assigned to the "anchoring structures" femur/pelvis/lungs. The vertebrae are deactivated in this step (transparent) to avoid wrong mesh to image vertebra assignments. All vertebrae are positioned according to the remaining components. (c) Deformable adaptation. In this final step, the segmentation is refined using local mesh deformations. All vertebrae are consecutively activated and adapted to the image (from sacrum to neck) to ensure correct vertebra labelings.

In the example implantation described below, the segmentation framework is based on adapting a surface model represented as a triangulated mesh to an input image. The surface model used for segmentation is shown in FIG. 1a. Since a direct vertebra segmentation from whole-body images is prone to localization errors, a combined model that includes tissues that serve as "anchoring structures" for the vertebrae: (1) pelvis/femur and (2) lungs is used. In other words, the femur/pelvis/lungs are initially segmented in order to initially place the vertebrae at their approximate position, within the capture range, before they are locally adapted to the image. The segmentation process consists of three steps which are described in more detail in document "*Automatic model-based segmentation of the heart in CT images*", IEEE Transactions on Medical Imaging, 27(9) (2008) 1189-1201 by Ecabert, O. et al.

In a first step of model localisation, the model is located in the image at approximately the correct position. In one example a localizer based on the generalized Hough Transform (GHT) is used which attempts to align mesh triangles with image gradients.

In a second step of parametric adaptation, multiple transformations of the anchoring structures (different colours in FIG. 1b) are made in order to improve the alignment between mesh and image. In this step all vertebrae are deactivated (transparent in FIG. 1b) to avoid incorrect correspondences between mesh and image vertebra. They are passively scaled and positioned at their approximate location in the image based on the transformations of the anchoring structures.

In the third step of deformable adaptation, all anchoring structures are simultaneously adapted to the image using local deformations. The vertebrae are then successively activated (from sacrum to neck) to ensure a correct localization of each individual vertebra: first the lumbar vertebra 5 is activated and adapted to the image, then the next lumbar vertebra 4 is activated and adapted, then lumbar vertebra 3, etc. (FIG. 1c). This iterative activation and adaptation is repeated until the top thoracic vertebra 1 is reached.

Figure 2:
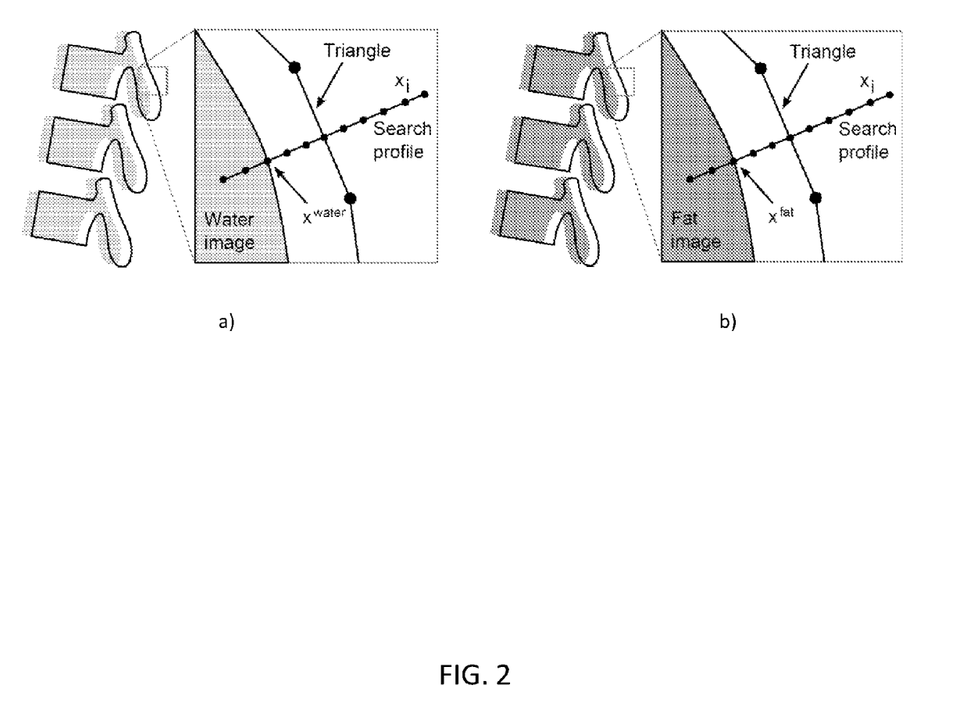
FIG. 2 illustrates target point detection using multi-modal image features a) Detecting water target point and b) Detecting fat target point. For each mesh triangle, a search profile is defined along the perpendicular triangle direction. Target points $x^{water}$ and $x^{fat}$ are detected as the points that maximize a feature response (such as the maximum image gradient) in the water (a) and in the fat image (b), respectively. During adaptation, the mesh triangle is simultaneously attracted to $x^{water}$ as well as to $x^{fat}$.

With reference to FIG. 2, during parametric as well as during deformable adaptation, the mesh triangles are attracted to image target points detected by the following algorithm. For each mesh triangle, a search profile is constructed in a direction perpendicular to the plane of the triangle for 21 points $x_i$ with $i \in [-1,1]$ and search for a target point that maximizes an image feature response $F(x_i)$. The feature response may be for example an image gradient or an expected intensity range:

$$x = \underset{\{x_i\}}{\operatorname{argmax}}[F(x_i)]. \qquad (1)$$

While commonly a single modality, or image, is being used for feature detection, in the present invention, multiple modalities are used, thus the Dixon water and fat images. FIG. 2 illustrates these multi-modal image features for a single triangle. First, the triangle attempts to detect a target point $x^{water}$ in the water image (FIG. 2a). Second, the same triangle attempts to detect a target point $x^{fat}$ in the fat image (FIG. 2b). This approach is repeated for all triangles on the mesh to derive a sequence of water target points $x_i^{water}$ as well as a sequence of fat target points $x_i^{fat}$. During adaptation an external energy term is minimized that simultaneously attracts the mesh triangles to all $x_i^{water}$ as well as to all $x_i^{fat}$. A simplified energy formulation can be described as:

$$E_{ext} = \sum_{i=0}^{T} [c_i - x_i^{water}]^2 + \sum_{i=0}^{T} [c_i - x_i^{fat}]^2, \quad (2)$$

where $c_i$ is the triangle centre with index i, and T is the number of mesh triangles.

To allow target point detections as shown in FIG. 2, image features were trained from ground truth annotations which were generated in a bootstrap-like approach. An initial model (with approximately 1000 triangles per vertebra) was manually adapted to the images of the first subject. This annotation was used for feature training once using the water and once using the fat image. The resulting model was adapted to the images of the second subject (using multi-modal image features as described above) and manually corrected if required. This annotation was included in a new feature training and the resulting model was applied to the images of the next subject. This process was repeated until ground truth annotations from all patients were available.

Figure 3:
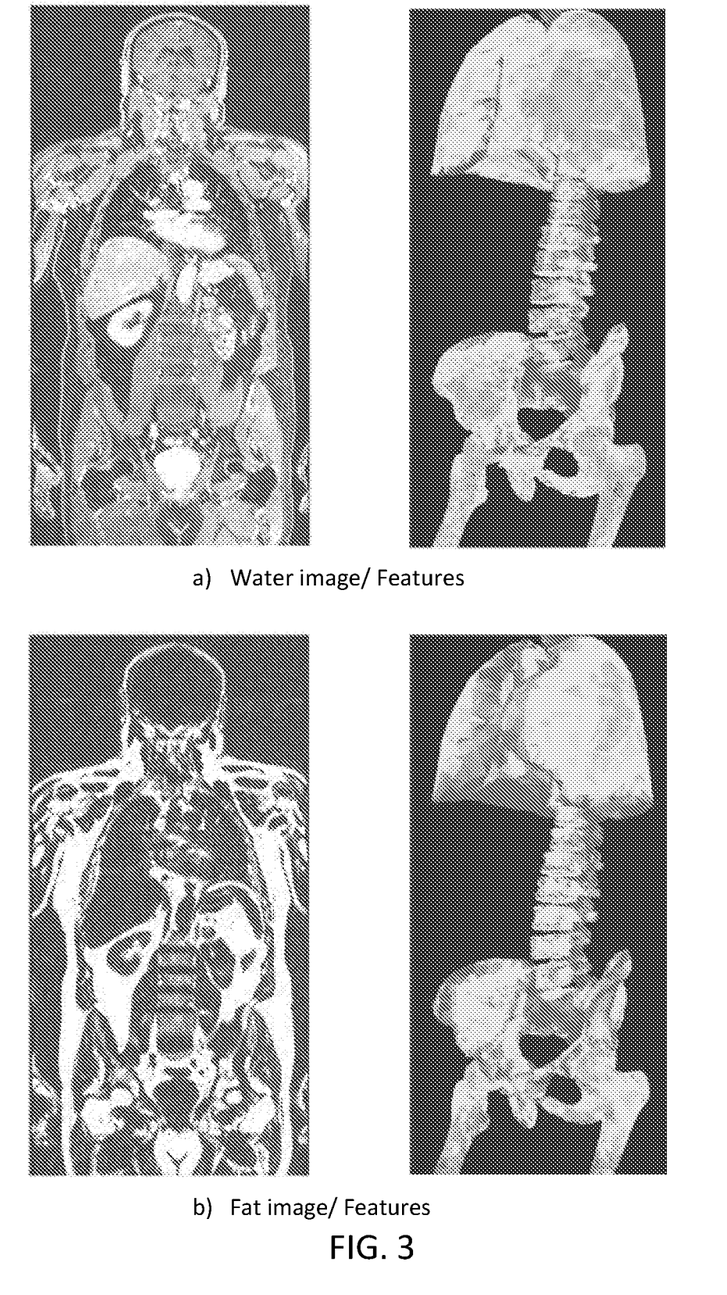
FIG. 3 illustrates trained image features. (a) Example water image from a single patient, Pat1, and the water feature responses in terms of simulated errors being trained on all patients. (b) Example fat image from Pat1 and the fat feature responses being estimated on all patients. The colour scale shows small simulated errors (green), i.e. features with high and localized response, to large simulated errors (red), i.e. features with low response. As can be observed, water features are better around the lungs and the femur and pelvic bones. However, features around the vertebrae appear similar, and a combination of both the water and the fat image is expected to provide most reliable feature responses rather than considering either the water or the fat features alone.

Example images of a single patient, Pat1, and the resulting multi-modal image features from all trainings are shown in FIG. 3, for the water (FIG. 3a) and for the fat image (FIG. 3b). As can be observed, water and fat features vary for all vertebrae, and it is not immediately discernible as to which feature is optimal. However, by combining both the water and the fat features, robust and accurate segmentation results are obtained as compared to the use of water or fat features alone.

Dixon MR images from 25 patients were acquired on a 3T MR Scanner (Philips Ingenuity TF PET/MR, Best, The Netherlands) using a quadrature body coil, with $TR/TE_1/TE_2$=3.2/1.11/2.0 ms and flip angle 10 degrees. Seven bed stations were acquired (30 mm overlap) to cover a field of view (FOV) from head to thigh. Each station was acquired with a FOV of 500×400×150 mm (right-left, anterior-posterior, feet-head), reconstructed axial resolution 0.8×0.8, 3 mm slice thickness, scan duration 17 s.

In order to separate the training set from the test set, a five fold cross approach was employed. All 25 patients were randomly grouped in five subsets. Four of the five subsets (20 patients) were used for training, the remaining one subset (5 patients) was used for segmentation. Segmentation accuracy was validated using mesh surface distances to the ground truth annotations. For each vertebra, we computed the mean distances over all triangles as well as the amount of triangles with errors of larger than 5 mm.

The multi-modal feature segmentation was also compared with single image segmentations. Three experiments were performed: (i) segmentation of the water image using water features, (ii) segmentation of the fat image using fat features, and (iii) segmentation of both the water and the fat image simultaneously using the proposed multi-modal image features. Note that for all experiments multi-modal features were used for initial model placement (Step 1 and Step 2 from Section 2.1), and the feature comparison was only performed in the last local adaptation step (Step 3. Deformable adaptation).

Figure 4:
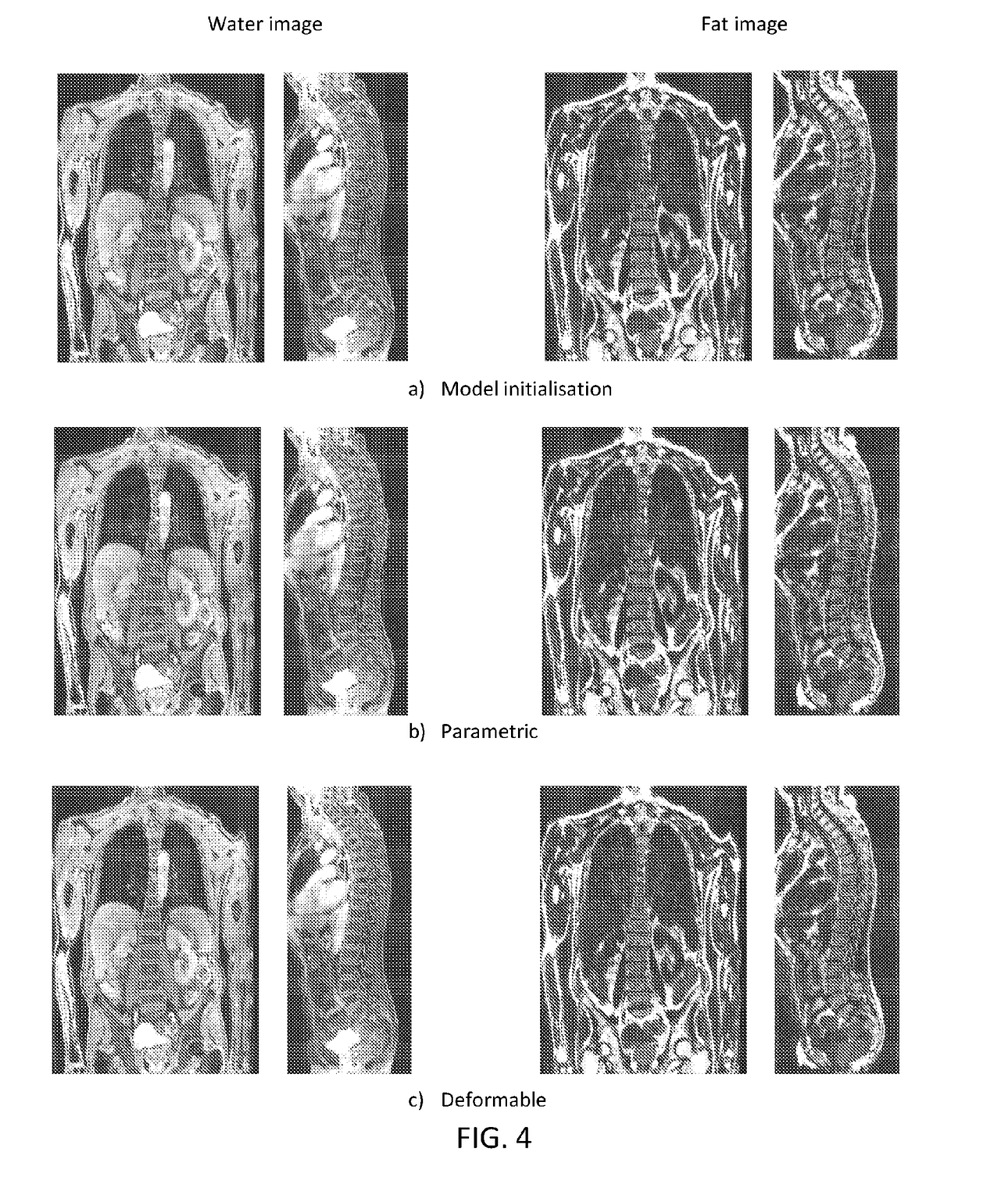
FIG. 4 illustrates segmentation steps from Pat2 using multi-modal features, overlaid onto the water (left) and the fat image (right). (a) Model localization. The complete model is positioned in the image. (b) Parametric adaptation. Multiple parametric transformations adapt the anchoring structures (red) to the image, while all vertebrae (yellow) are deactivated and passively transformed to avoid wrong vertebra correspondences. (c) Deformable adaptation. The vertebrae are iteratively activated and adapted to the image (from sacrum to neck). This last step finalizes the segmentation.

The segmentation steps of the adaptation process using the multi-modal image features are shown in FIG. 4 (overlaid onto both the water and fat image). FIG. 4a shows the model initialization, i.e. the initial placement of the mean model according to the GHT. The segmentation is then refined in FIG. 4b using parametric transformations. After this step, all vertebrae are approximately at their correct positions and within the capture range of the deformable adaptation. During the last deformable adaptation (FIG. 4c), all mesh components including the vertebrae are locally adapted to the image which completes the segmentation.

Figure 5:
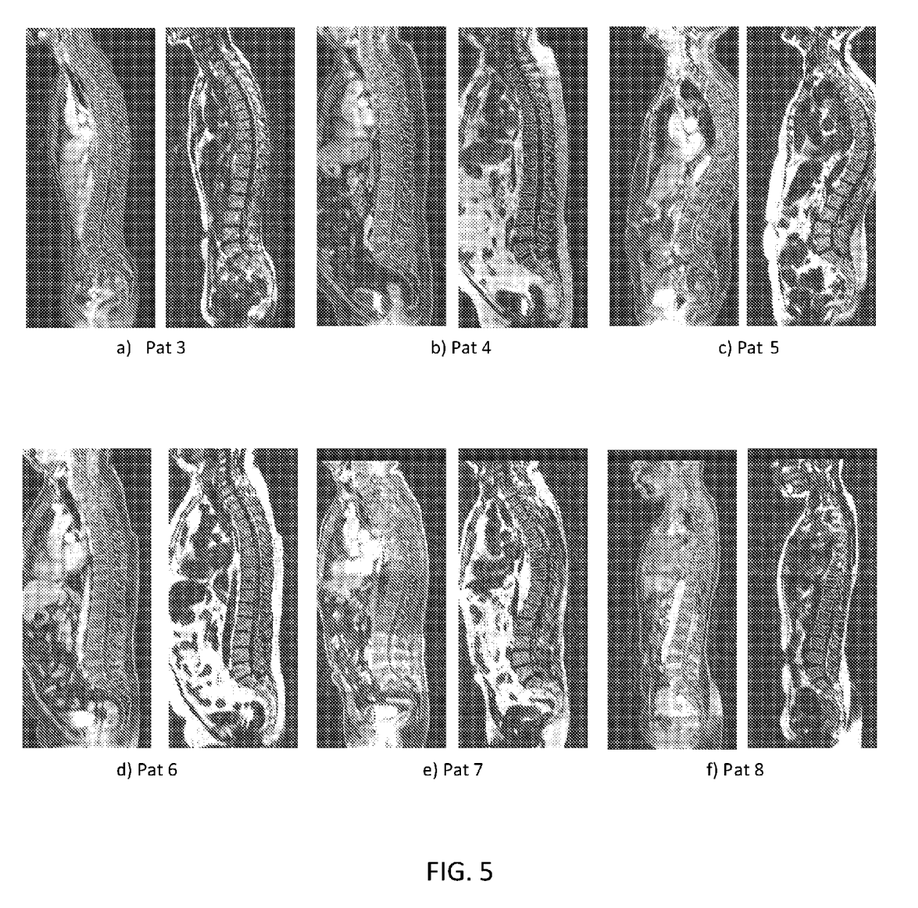
FIG. 5 illustrates segmentation results from six patients, Pat3 to Pat8 (a-f), using the proposed multi-modal image features. For each patient, segmentation results are overlaid onto the water (left) as well as onto the fat image (right), in sagittal view only. All vertebrae were segmented correctly, with a minimum error (over all vertebrae) of 0.99 mm (0.28% of the triangles showing an error of >5 mm) for Path, and a maximum error of 1.81 mm (6.40%) for Pat4. As can be observed, our method is robust against patient size (Pat3 vs. Pat4), spine shape (Pat5 vs. Pat6), and stitching artefacts (Pat7 and Pat8).

FIG. 5 shows results from six other patients, showing vertebra segmentations in sagittal view, again overlaid onto the water and the fat images. As can be observed, our approach successfully segmented the vertebrae in all examples. Compared to the ground truth annotations over all vertebrae, a minimum mean error of 0.99 mm (0.28% of the triangles showing an error of >5 mm) was observed for Pat1, and a maximum mean error of 1.81 mm (6.40%) for Pat4.

Figure 6:
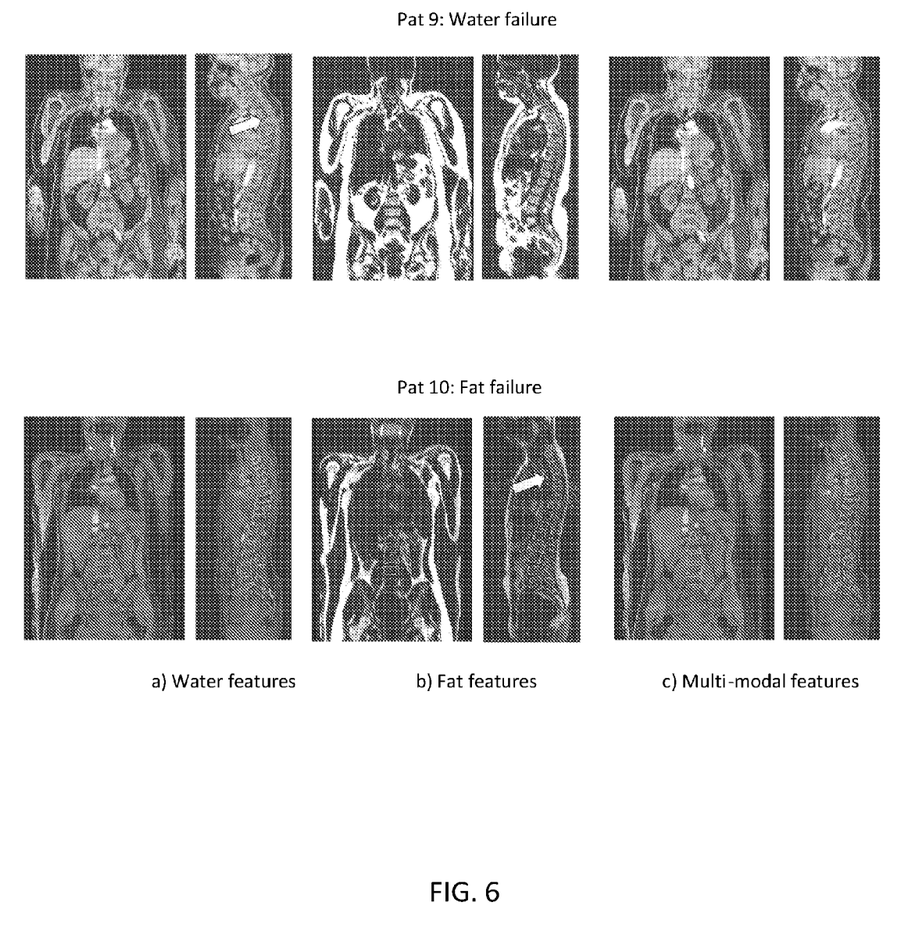
FIG. 6 illustrates a segmentation comparison for two patients, Pat9 (top) and Pat10 (bottom), using (a) water features (overlaid onto the water image), (b) fat features (overlaid onto the fat image), (c) multi-modal features (only overlaid onto the water image here). For Pat9, segmentation using only the water image fails around the top thoracic vertebrae due to low image contrast (largest error of 14.27 mm in thoracic vertebra 4). For Pat10, segmentation using only the fat image again fails around the top thoracic vertebrae (largest error of 15.48 mm in thoracic vertebra 6). Segmentation using multi-modal features remains robust in both cases (maximum error for Pat9: 4.00 mm (thoracic vertebra 5) maximum error for Pat10: 4.75 mm (thoracic vertebra 7)).

FIG. 6 shows a segmentation comparison when (i) using only water features, (ii) using only fat features and (iii) using the proposed multi-modal (water and fat) features for two other patients, Pat9 and Pat10. For Pat9, segmentation using water features only showed large errors of up 14.27 mm (thoracic vertebra 4, arrow in FIG. 6a). Image contrast appears low in that region and the water model was not able to provide accurate segmentation. Similarly, for Pat10, segmentation using fat features only showed large errors of up to 15.48 mm (thoracic vertebra 6, arrow in FIG. 6b). For comparison, segmentation using multi-modal image features (FIG. 6c) provided accurate results for both patients with maximum errors of 4.00 mm (thoracic vertebra 5) and 4.75 mm (thoracic vertebra 7), respectively.

Table 1 shows results for each vertebra in the mean over all 25 patients, from lumbar vertebra 5 (close to pelvis) to thoracic vertebra 1 (close to neck). Considering all vertebrae and all patients, using the water and fat images alone led to a segmentation error of 2.89 mm (15.90% with >5 mm error) and 2.22 mm (9.43%), respectively. Our proposed multi-modal feature approach showed a clear reduction to 1.69 mm (5.17%). Note that for all feature cases, the top thoracic vertebra 1 showed the largest error due to low image contrast in most images.

TABLE 1

Validation of vertebra segmentations from all 25 patients.

| Anatomical region | Surface distances | | |
| --- | --- | --- | --- |
|  | Water features | Fat features | Combined features |
| Thoracic vertebra 1 | 4.71 mm (36.32%) | 3.85 mm (25.58%) | 3.76 mm (24.87%) |
| Thoracic vertebra 2 | 4.76 mm (29.06%) | 3.03 mm (18.21%) | 2.54 mm (11.44%) |
| Thoracic vertebra 3 | 4.02 mm (28.33%) | 2.47 mm (12.60%) | 1.67 mm (4.55%) |
| Thoracic vertebra 4 | 4.34 mm (31.33%) | 2.79 mm (14.01%) | 1.96 mm (6.85%) |
| Thoracic vertebra 5 | 3.62 mm (25.86%) | 3.03 mm (15.05%) | 2.01 mm (8.29%) |
| Thoracic vertebra 6 | 3.77 mm (25.05%) | 2.93 mm (13.23%) | 1.84 mm (6.79%) |
| Thoracic vertebra 7 | 3.45 mm (23.99%) | 2.99 mm (14.21%) | 1.94 mm (7.81%) |
| Thoracic vertebra 8 | 3.07 mm (17.03%) | 2.72 mm (13.19%) | 1.78 mm (6.31%) |
| Thoracic vertebra 9 | 2.76 mm (12.56%) | 2.59 mm (13.69%) | 1.57 mm (4.24%) |

TABLE 1-continued

Validation of vertebra segmentations from all 25 patients.

| Anatomical region | Surface distances | | |
|---|---|---|---|
| | Water features | Fat features | Combined features |
| Thoracic vertebra 10 | 2.37 mm (8.87%) | 1.97 mm (8.10%) | 1.33 mm (1.12%) |
| Thoracic vertebra 11 | 1.64 mm (4.23%) | 1.50 mm (3.27%) | 1.23 mm (0.19%) |
| Thoracic vertebra 12 | 1.92 mm (5.28%) | 1.38 mm (1.35%) | 1.25 mm (0.77%) |
| Lumbar vertebra 1 | 1.79 mm (4.83%) | 1.32 mm (1.52%) | 1.21 mm (1.35%) |
| Lumbar vertebra 2 | 1.70 mm (4.39%) | 1.36 mm (2.73%) | 1.20 mm (1.80%) |
| Lumbar vertebra 3 | 1.55 mm (4.12%) | 1.14 mm (0.31%) | 1.04 mm (0.32%) |
| Lumbar vertebra 4 | 1.71 mm (4.04%) | 1.14 mm (0.41%) | 1.08 mm (0.25%) |
| Lumbar vertebra 5 | 1.95 mm (4.93%) | 1.45 mm (2.86%) | 1.29 mm (0.87%) |
| Whole spine | 2.89 mm (15.90%) | 2.22 mm (9.43%) | 1.69 mm (5.17%) |

A fully automatic model-based approach to segment the vertebrae from Dixon MR images has been described herein. The approach can be used in hybrid PET/MR imaging systems to include bone tissue in PET attenuation correction (AC) without the need of additional MR sequences for bone visualization, such as UTE.

Consequent to the segmentation described above, an attenuation map for use in PET imaging which properly accounts for the attenuation of cortical bone structures may be generated by assigning a gamma photon attenuation coefficient characteristic of the attenuation of cortical bone to the one or more volumes bounded by the surface mesh model. By properly accounting for the attenuation of cortical bone the quality of PET images reconstructed with the attenuation map may be improved. Conventionally the inability to identify cortical bone would have been addressed by assigning an incorrect attenuation coefficient characteristic of soft tissue to such regions, or the attenuation of such regions would have been ignored altogether.

Figure 7:
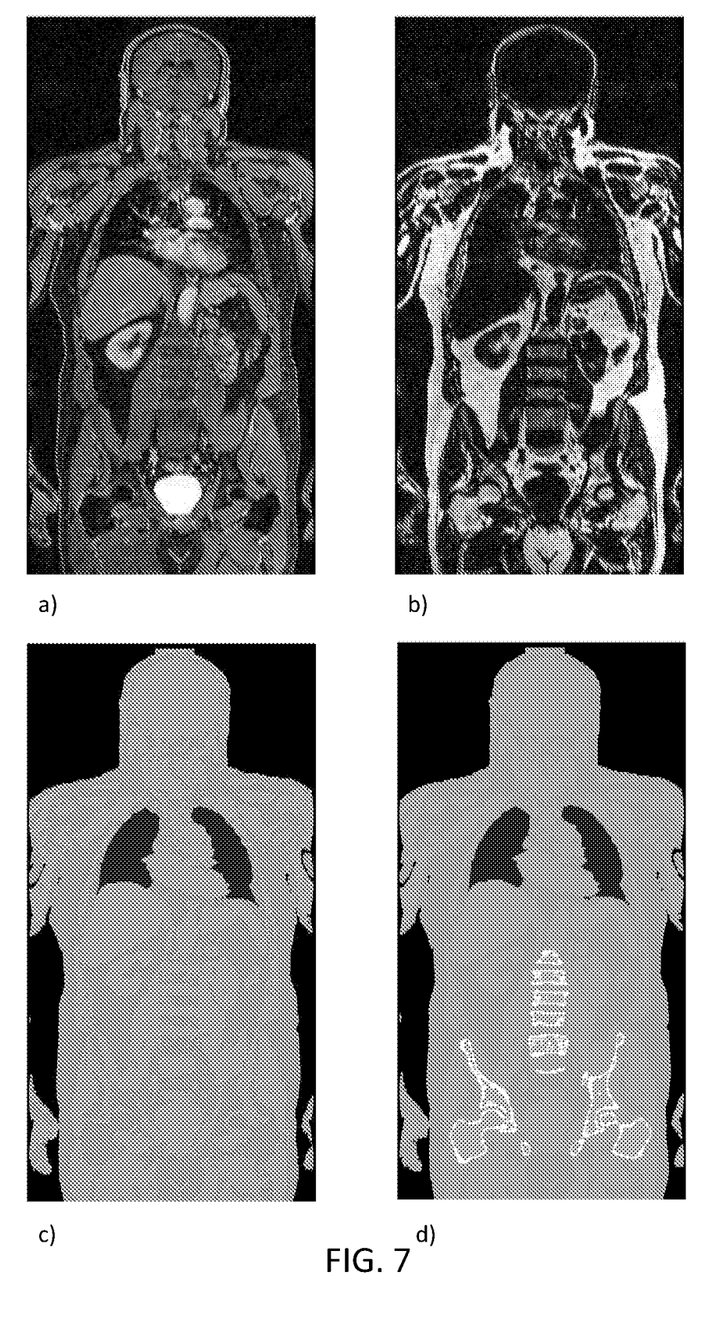
FIG. 7 illustrates a) an MR Dixon water image b) an MR Dixon fat image c) a prior art attenuation map generated from MR data which does not account for cortical bone and d) an MR attenuation map in accordance with the present invention in which both cortical bone and bone marrow are accounted for as two additional compartments.

Further analysis of the MR Dixon fat image may also be used to discriminate between cortical bone, and bone marrow. Consequently an attenuation coefficient characteristic of the attenuation of bone marrow may be assigned to bone marrow regions. In so doing the accuracy of the attenuation map may be further improved, thereby further improving the accuracy of reconstructed PET images. Discrimination between the cortical bone and the bone marrow may be achieved by assigning a second attenuation coefficient corresponding to the attenuation of bone marrow to regions, or volumes for which a threshold condition based on the intensity of the MR Dixon fat image is met. This is illustrated with reference to FIG. 7 which illustrates a) an MR Dixon water image b) an MR Dixon fat image c) a prior art attenuation map generated from MR data which does not account for cortical bone and d) an MR attenuation map in accordance with the present invention in which both cortical bone and bone marrow are accounted for. In the example illustrated in FIG. 7b, bright, or high intensity regions bounded by the surface mesh model are assigned an absorption coefficient corresponding to the absorption of bone marrow, and darker, lower intensity, regions within the surface mesh model are assigned an absorption coefficient corresponding to the absorption of cortical bone.

While common approaches used a single image for segmentation (such as a T1- or T2-weighted image), the experiments have shown that use of a single image from the Dixon sequence alone (i.e. the water or fat image) might lead to large segmentation errors due to varying image contrasts: in some cases image contrast between the vertebrae is better in the water image, in other cases contrast is better in the fat image. The multi-modal feature approach disclosed herein uses both the water and the fat image simultaneously for segmentation. Considering all patients, the combined feature responses reduced the segmentation error from 2.89 mm (water)/2.11 mm (fat) to 1.69 mm, which is an improvement of up to 41%. The method provided accurate segmentation results for all of the 25 patients. It is robust against variations in patient size (comparing slim Pat3 with big Pat4), against variations in the spine shape (comparing the curved spine shape in Pat5 with the straight shape in Pat6), as well as against stitching artefacts when combining images from multiple bed positions (horizontal streaks in Pat7 or Pat8).

The current approach was used to derive a model-based segmentation from two input images (water and fat image). However, this approach can also be applied to more than two images. Alternative applications might be the segmentation of a diffusion image series or a dynamic contrast enhances image series to maximize image contrast and segmentation accuracy compared to only using a single image from the series. In our PET/MR application, we will also investigate the inclusion of the PET image into the presented Dixon segmentation allowing us to derive a single segmentation from anatomical (Dixon MR) as well as functional (PET) contrasts.

In future work, we plan to further develop the model. We will include more patients for training, and we will attempt to minimize large segmentation errors such as of the last thoracic vertebra 1, for example by including more prior shape knowledge into the segmentation process. While the validation of this paper was focused on the segmentation of the vertebrae, we also plan to validate the segmentation accuracy of the remaining model components. This will lead us to our overall goal of whole-body AC with five compartments (background, lung tissue, watery tissue, and fatty tissue, and bone tissue).

To summarise, a method for improved MR image segmentation has been disclosed which allows for the segmentation of cortical bone. The method has been described with particular reference to the extraction of vertebrae from Dixon MR images. The method also finds application in the generation of PET attenuation maps for MR-based PET attenuation correction. The invention may also be used in computer-aided diagnosis of diseases such as spinal disc degeneration, automated spine scan planning, or image-guided interventions such as computer-assisted surgery.

Whilst the invention has been illustrated and described in detail in the drawings and foregoing description, such illustrations and description are to be considered illustrative or exemplary and not restrictive; the invention is not limited to the disclosed embodiments and can be used for the segmentation of MR Dixon image data in general.

The invention claimed is:

1. A method for segmenting MR Dixon image data; the method comprising the steps of:
   receiving an MR Dixon water image relating to a region of interest;
   receiving an MR Dixon fat image relating to a region of interest;
   adapting a surface mesh model having a plurality of mesh elements to the region of interest by:
      for each mesh element in the region of interest:
         selecting, from the current mesh element position and from a plurality of positions displaced from the current mesh element position, a water target position based on a water image feature response in the MR Dixon water image;
         selecting, from the current mesh element position and from a plurality of positions displaced from the current mesh element position, a fat target position based on a fat image feature response in the MR Dixon fat image; and
      displacing each mesh element from its current position to a new position based on both its water target position and its corresponding fat target position.

2. A method according to claim 1 wherein:
   the water image feature response is based on at least one of: an intensity in the water image, a gradient of the intensity in the water image; and
   the fat image feature response is based on at least one of: an intensity in the fat image, a gradient of the intensity in the fat image.

3. A method according to claim 1 wherein:
   the water image feature response is based on at least one of: the difference between the intensity in the water image and the intensity in a reference water image, the difference between the gradient of the intensity in the water image and the gradient of the intensity in a reference water image; and
   the fat image feature response is based on at least one of: the difference between the intensity in the fat image and the intensity in a reference fat image, the difference between the gradient of the intensity in the fat image and the gradient of the intensity in a reference fat image.

4. A method according to claim 1 wherein the new position minimises the energy for all water target positions and all fat target positions.

5. A method according to claim 1 wherein the new position is based on an energy minimum computed for all water target positions and all fat target positions.

6. A method according to claim 1 wherein the new position is based on an energy minimum computed for all water target positions and all fat target positions; wherein the energy is computed for each water target position and for each fat target position using a least squares method.

7. A method according to claim 1 wherein prior to the step of adapting the surface mesh model: the surface mesh model is coarsely aligned to the region of interest by:
   mapping an anchoring feature in the surface mesh to a corresponding anchoring feature in the region of interest;
   wherein the anchoring feature comprises at least a portion of a pelvis, a femur or a lung.

8. A method according to claim 7 wherein the coarse alignment includes the method steps of:
   executing a Hough Transform to align each mesh element in the region of interest with an image gradient; and
   iteratively displacing the anchoring feature in order to improve alignment between the surface mesh model and the region of interest.

9. A method for obtaining a PET attenuation map; the method comprising the method steps of claim 1 and further including the method steps of:
   assigning at least one gamma photon attenuation coefficient to at least one volume bounded by the surface mesh model.

10. A method according to claim 9 wherein a first gamma photon attenuation coefficient corresponding to the attenuation of cortical bone is assigned to at least one cortical bone volume bounded by the surface mesh model; and
   a second gamma photon attenuation coefficient corresponding to the attenuation of bone marrow is assigned to at least one bone marrow volume within the cortical bone volume;
   wherein the bone marrow volume is distinguished from the cortical bone volume based on the intensity in the fat image in relation to a reference intensity value.

11. A method according to claim 9 wherein a first gamma photon attenuation coefficient corresponding to the attenuation of a first anatomical bone type is assigned to a first volume bounded by the surface mesh model; and
   a second gamma photon attenuation coefficient corresponding to the attenuation of a second anatomical bone type is assigned to a second volume bounded by the surface mesh model;
   wherein the first and second anatomical bone types are different and wherein the first and second gamma photon attenuation coefficients are different.

12. A method according to claim 9 wherein a spatially-varying gamma photon attenuation coefficient is assigned to a volume bounded by the surface mesh model; wherein the value of the gamma photon attenuation coefficient is determined in accordance with a template distribution for the volume.

13. A method according to claim 1 wherein the segmentation is executed without the acquisition of either an ultrashort echo time (UTE) MR sequence or a T1- or a T2-weighted MR image.

14. A processor configured to execute the method steps of claim 1.

15. A computer program product on a non-transitory computer readable medium comprising instructions which when executed on a processor cause the processor to carry out the method steps of claim 1.

* * * * *